(12) United States Patent
Yao et al.

(10) Patent No.: US 11,372,038 B2
(45) Date of Patent: Jun. 28, 2022

(54) MAGNETIC FIELD BASED WIRELESS GMD/EMP-E3 IMPACT MONITORING DEVICE

(71) Applicant: University of Tennessee Research Foundation, Knoxville, TN (US)

(72) Inventors: Wenxuan Yao, Knoxville, TN (US); Jiecheng Zhao, Knoxville, TN (US); Yi Cui, Knoxville, TN (US); Yilu Liu, Knoxville, TN (US); Thomas J. King, Knoxville, TN (US)

(73) Assignees: University of Tennessee Research Foundation, Knoxville, TN (US); UT-BATTELLE, LLC, Oak Ridge, TN (US)

( * ) Notice: Subject to any disclaimer, the term of this patent is extended or adjusted under 35 U.S.C. 154(b) by 660 days.

(21) Appl. No.: 15/349,779

(22) Filed: Nov. 11, 2016

(65) Prior Publication Data

US 2018/0136267 A1    May 17, 2018

(51) Int. Cl.
*G01R 31/00* (2006.01)
*G01R 33/02* (2006.01)
*G01R 31/08* (2020.01)

(52) U.S. Cl.
CPC ........... *G01R 31/001* (2013.01); *G01R 33/02* (2013.01); *G01R 31/085* (2013.01)

(58) Field of Classification Search
CPC ............................ G01R 31/001; G01R 31/021
USPC ........................................................ 702/65
See application file for complete search history.

(56) References Cited

U.S. PATENT DOCUMENTS

| | | | | |
|---|---|---|---|---|
| 5,745,384 A | * | 4/1998 | Lanzerotti | G01D 3/032 324/323 |
| 8,954,608 B1 | * | 2/2015 | Tomic | G06F 1/12 370/503 |
| 2004/0036638 A1 | * | 2/2004 | Lipka | H03M 7/3015 341/143 |
| 2012/0095709 A1 | * | 4/2012 | Smith | G01R 31/025 702/65 |
| 2015/0226772 A1 | * | 8/2015 | Kreikebaum | G01R 15/202 324/244 |
| 2016/0126738 A1 | * | 5/2016 | Moore | H02J 3/18 361/35 |
| 2016/0197469 A1 | * | 7/2016 | Fuchs | H02H 7/04 361/35 |

(Continued)

*Primary Examiner* — Eman A Alkafawi
(74) *Attorney, Agent, or Firm* — Myers Bigel, P.A.

(57) ABSTRACT

A system and methods for monitoring an impact of geomagnetic disturbances (GMDs) or an E3 component of electromagnetic pulses (EMP-E3), involving a transducer generating a transduced signal in response to a magnetic field of a current carrying element of a transmission line. The transduced signal reflects harmonic characteristics of the current carrying element, and is amplified and filtered, then digitally converted. Excessive impact is detected when a threshold condition is met with respect to a total harmonic distortion (THD) and/or a change in THD. The THD can be calculated from amplitudes of harmonic components of interest. The amplitudes can be calculated in various ways, including Fourier transforming the digital signal to locate peaks in the resulting spectral lines, or using a phase sensitive detection algorithm in which the digital signal is multiplied by a phase swept reference signal and then integrated.

20 Claims, 4 Drawing Sheets

(56) References Cited

U.S. PATENT DOCUMENTS

2016/0231367 A1* 8/2016 Cox .................. G01R 29/0878
2017/0227592 A1* 8/2017 Berler ................ G01R 31/1245

* cited by examiner

MAGNETIC FIELD BASED WIRELESS GMD/EMP-E3 IMPACT MONITORING DEVICE

STATEMENT REGARDING FEDERALLY SPONSORED RESEARCH OR DEVELOPMENT

This invention was made with government support under Award Number EEC1041877, awarded by the National Science Foundation (NSF). The government has certain rights in the invention.

BACKGROUND

Geomagnetic disturbances (GMDs) and the E3 component of electromagnetic pulses (EMP-E3) are serious threats to electronic equipment and power grids. During GMDs or EMPs, low-frequency (e.g., 0.1 mHz-0.1 Hz) geomagnetically induced currents (GICs) are produced in power systems. The GICs are magnetic currents that cause a transformer in the power system to go into half-cycle saturation, which in turn produces large even and odd harmonics. These harmonics can overload capacitors in the power grids and cause protection mechanisms to trip so that the capacitors disconnect from the grids. Lack of capacitive support has led to voltage collapse and power system blackouts. Therefore, it is necessary to monitor the harmonic currents, which directly reflect the level of impact of GMD/EMP-E3, in order to prepare for or mitigate the impact.

There are two basic methods to monitor GMD/EMP-E3 impact:

(1) Measuring GIC on the power lines or on the neutrals of power transformers.

(2) Monitoring the changes in the power system environment, such as high harmonic distortion or abnormal reactive flows (e.g., detecting high reactive power consumption).

Currently, systems using either of the two methods mentioned above require direct electrical contacts with the power lines or transformer, i.e., a physical connection, in order to acquire a signal for analysis, making the setup process relatively complex. The physical connection incurs installation and maintenance costs, which limit widespread deployment of a GMD/EMP-E3 impact monitor. In some locations, it may be difficult or even impossible to set up a GMD/EMP-E3 impact monitoring device because of the expense or complexity of installation. For example, low accessibility and low portability may limit the deployment of GMD/EMP-E3 impact monitoring devices in wide-area electric systems.

Therefore, there is a need for a GMD/EMP-E3 impact monitoring device that is inexpensive to deploy, without significant performance degradation or complex setup processes. The present disclosure addresses this need using a non-contact approach to GMD/EMP-E3 impact monitoring.

DETAILED DESCRIPTION

Embodiments of the present disclosure relate to a wireless GMD/EMP-E3 impact monitoring device using a magnetic field transducer. Since the harmonic characteristics of a transmission line are reflected in the magnetic field generated by electric currents carried in the transmission line, it is feasible to detect harmonics and monitor GMD/EMP-E3 impact without a physical connection to the transmission line, by measuring the magnetic fields. Thus, the harmonic distortion, which can reflect the impact of GMD/EMP-E3, is measured using a signal acquired from the magnetic field transducer.

The fast Fourier transform (FFT) is widely used for measuring harmonics. To compress the aliasing effect, spectrum leakage and picket fence effects of traditional FFT, a method according to the present disclosure combines weighting of samples by a window function and a two-point interpolated FFT for spectrum correction. Using this approach, the amplitude of a harmonic of interest can be calculated as a measure of the harmonic distortion, combined with amplitudes of other harmonics of interest to produce a total distortion metric, which is supplied to a threshold detection algorithm that determines GMD/EMP-E3 impact.

In another embodiment, a discrete Fourier transform (DTF) or other algorithm is used to estimate a frequency of a fundamental component in the signal from the transducer, and then a phase sensitive detection (PSD) method is applied to the estimated fundamental frequency to calculate the harmonic amplitude.

Figure 1:
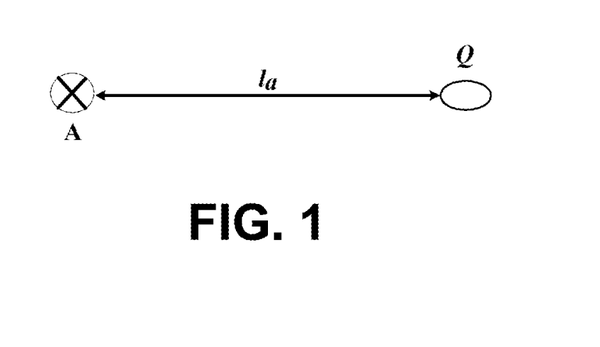
FIG. 1 illustrates a magnetic field of an infinite straight conductor.

According to Ampere's Law, an AC current carrying conductor will produce a magnetic field in the surrounding atmosphere, as well as in nearby objects. Consider the hypothetical infinite length, current carrying transmission line A in FIG. 1. The line A has an AC current I defined by $$I = \sum_{h=1}^{H} G_h \sin(2\pi f_0 h t + \varphi_h) \quad \text{Eq. 1}$$

where t denotes the time, $f_0$ is the fundamental frequency, H is the highest order harmonic for which an amplitude will be calculated, and $\varphi_h$ and $G_h$ are the angle and the amplitude for the h-th harmonic, respectively.

The magnetic field B at point Q can be expressed as $$B = j_a \frac{\mu I}{2\pi l_a} = j_a \frac{\mu \sum_{h=1}^{H} G_h \sin(2\pi f_0 h t + \varphi_h)}{2\pi l_a} \quad \text{Eq. 2}$$

where μ is the magnetic permeability of the medium, $j_\alpha$ is the unit direction, and $l_a$ is the distance from the line A to a point Q. The harmonic component is reflected in the AC magnetic field B. Thus by measuring the harmonic component of the magnetic field B, the harmonic components of the transmission line A can be obtained.

Transmission lines are rarely found in isolation. In practice, there are often several transmission lines overhead. The superposition principle can be applied to the magnitude of the magnetic field vectors in such cases. If the harmonic component percentages are the same for every transmission line (meaning the percentage contribution by an individual transmission line to any given harmonic is the same across all transmission lines), the harmonic percentage of the combined magnetic field for all transmission lines will equal the percentage of magnetic field induced from any individual transmission line.

An electromotive force will be induced due to the changing of magnetic flux. Suppose there is a transducer with an M-turn coil at the point Q, then the induced electromotive force EF, can be expressed as $$EF = M\frac{d\Phi}{dt} \qquad \text{Eq. 3}$$

where Φ is the total magnetic flux, which can be expressed as $$\Phi = S \times \cos\gamma_\alpha \times B \qquad \text{Eq. 4}$$

where S is the area of the coil and $\gamma_\alpha$ is the angle between the magnetic field line and a plane perpendicular to the coil surface. Induced voltage in a coil of M turns at a point Q can be calculated by $$EF = \frac{Ms\cos\gamma_a\mu\sum_{h=1}^{H}G_hf_0h\cos(2\pi f_0 ht + \varphi_h)}{l_a} \qquad \text{Eq. 5}$$

For the above equation, the amplitude of the h-th order harmonic component in the transmission line current is amplified by h times in the induced voltage compared with the fundamental component.

Figure 2:
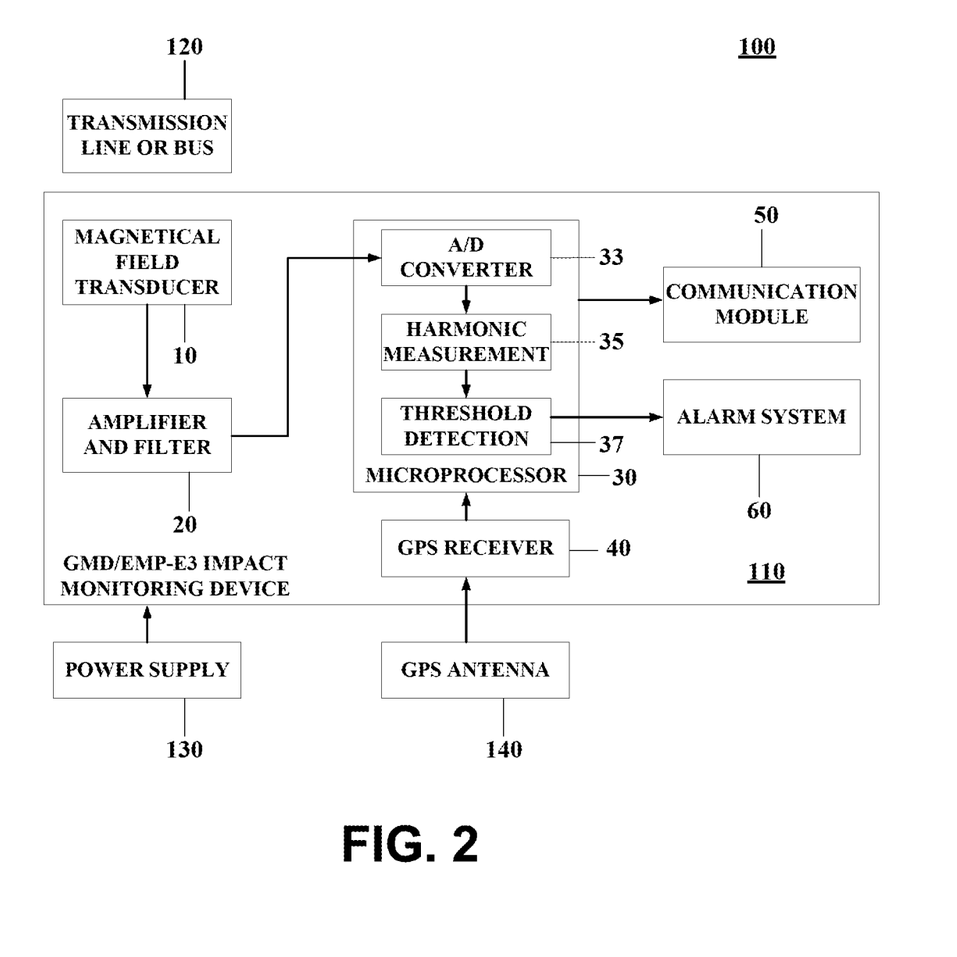
FIG. 2 illustrates a system according to an embodiment of the present disclosure.

FIG. 2 illustrates a system 100 according to an embodiment of the present disclosure. The system includes an impact monitoring device 110, a transmission line or bus 120, a power supply 130, and a global positioning system (GPS) antenna 140. The impact monitoring device 110 includes a transducer 10, an amplifier and filter unit 20, a microprocessor 30, a GPS receiver 40, a communication module 50, and an alarm system 60.

The transducer 10 measures the harmonic characteristic of a current carrying element in the transmission line or bus 120 and outputs a voltage signal representative of the harmonic characteristic. The transmission line or bus may be a component in a power delivery system, e.g., a line connecting a transformer to a substation or a consumer. The current carrying element is any physical material through which current is conducted along the transmission line or bus, such as a copper core of a cable. The transducer 10 may be installed near the transmission line or bus 120 and oriented relative to the line 120 so as to maximize the amplitude of the voltage signal. The voltage signal is received by an amplifier in the unit 20. The amplifier generates an amplified voltage signal that is sent to a low pass filter in the unit 20. The low pass filter generates a filtered signal that is received by the microprocessor 30.

The microprocessor 30 uses an analog-to-digital (A/D) converter 33 to sample the filtered signal. The A/D converter may, but need not, be internal to the microprocessor 30. In an alternative embodiment, the A/D converter 33 is external to the microprocessor 30 and integrated into the impact monitoring device 110. The A/D converter 33 is synchronized by a pulse per second (PPS) signal, which is generated by the GPS receiver 40 using at least one time signal transmitted from one or more GPS satellites. Each time signal is received via GPS antenna 140 or some other receiving device capable of receiving GPS signals, and then processed to calibrate the PPS signal. The PPS signal is generated internally by the GPS receiver 40, for example using a clock generator circuit. The time signal(s) ensure that the PPS signal is accurate. The calibrated PPS signal is then provided by the GPS receiver 40 to the microprocessor to control the A/D converter 33.

The antenna or receiving device 140 may be integrated into the GPS receiver 40 and enables the GPS receiver to acquire a satellite signal, so that the receiver can extract the time signal from the satellite signal, calibrate the PPS signal using the time signal, and then provide the PPS signal to the microprocessor 30. The microprocessor includes a harmonic measurement module 35 that implements an algorithm to calculate a measure of harmonic distortion using the digital data from A/D converter 33. The harmonic distortion measurement is then provided to a threshold detection module 37.

The threshold detection module 37 implements a GMD/EMP-E3 impact threshold detection algorithm using at least one threshold value, e.g., a threshold for total harmonic distortion (THD). In one embodiment, both the THD and the change in THD over time are used as metrics for impact detection. For example, the microprocessor may trigger the alarm system 60 when both the THD and the change of THD exceed respective threshold values. Regardless of whether any of the thresholds are exceeded, the microprocessor may send the THD and other impact relevant data, such as amplitude values, to communication module 50 so that the module 50 can transmit, e.g., via the Internet, the THD and other impact relevant data to a remote server for storage and subsequent retrieval.

The power supply 130 furnishes any power required by the GMD/EMP-E3 impact monitoring device 110. The various components of the impact device 110 may run on the same power level, e.g., a common voltage, in which case the power supply 130 might output a single voltage or current to a shared supply rail. If the components run on different power levels, the power supply might generate multiple voltages or currents for output to the components, e.g., via a bus.

The electrical characteristics of transmission line 120 are monitored and calculated by GMD/EMP-E3 impact monitoring device 110 without requiring a physical connection to the transmission line 120. The device 110 is able to do this through measurement of the magnetic fields generated by electric currents carried in the transmission line, using transduction.

A magnetic flux passing through a turn of a coil induces an electric signal in the coil turn that is directly proportional to the rate of change of the magnetic flux. A coil with multiple turns has an induced total voltage equal to the sum of the voltage induced on each individual coil turn. For these reasons, when a coil of wire is placed in the magnetic field of a transmission line, the coil's induced voltage may be measured and used to calculate the harmonic distortion of the current.

Figure 3:
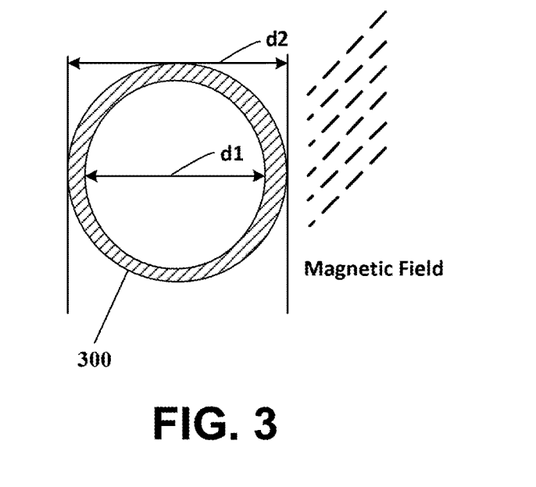
FIG. 3 illustrates a top view of a magnetic field transducer according to an embodiment of the present disclosure.

FIG. 3 is a top view of an exemplary magnetic field transducer coil 300. Magnetic field transducer coils may be specified by their number of turns, the coil inner diameter $d_1$, and the coil outer diameter $d_2$. The strength of the signal induced in a coil by a magnetic field is directly proportional to the magnetic flux permeability within the coil's core. The inventors have found that the greater of the number of turns or inner diameter $d_1$, the stronger the signal generated by the magnetic field transducer. Consequently, it is desirable to construct a magnetic field transducer with as many turns as possible so as to provide the maximum possible output signal. On the other hand, for the reasons of portability and low cost of implementing the GMD/EMP-E3 impact monitoring device, the size of the magnetic field transducer should be as small as possible. In balancing these competing factors, the inventors have found that a coil configuration suitable for use as a magnetic field transducer in an impact monitoring system according to the present disclosure is a coil with 1000 turns, inner diameter of 15 cm, and external diameter of 18 cm. However, these are exemplary parameters and other coil configurations are possible.

Figure 4:
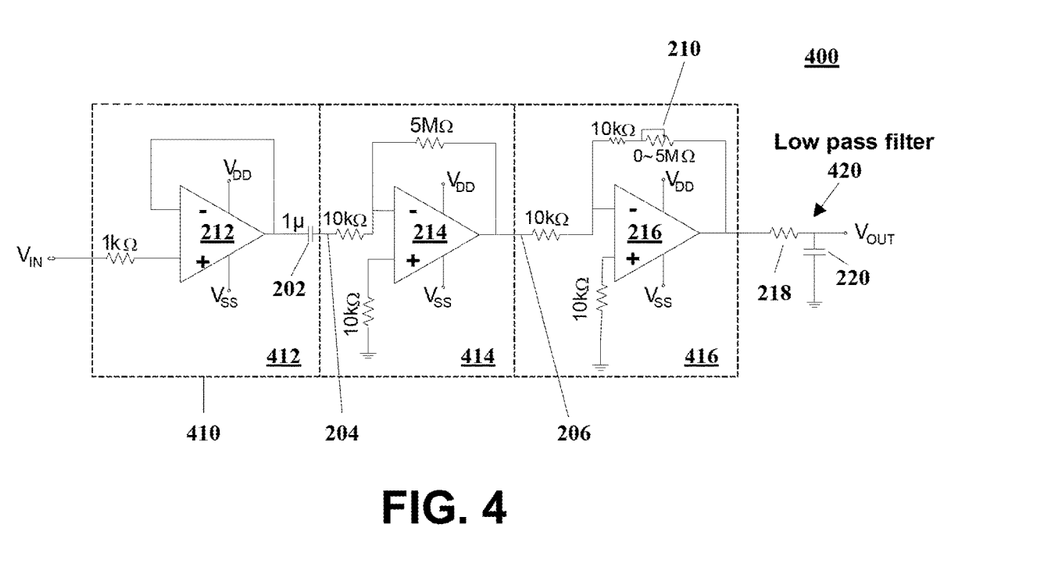
FIG. 4 illustrates a schematic of an amplifier and low pass filter according to an embodiment of the present disclosure.

FIG. 4 is a schematic diagram of an exemplary amplifier and filter circuit 400 with an amplifier 410 and a low pass filter 420. The amplifier 410 includes a voltage follower 412 and a two-stage amplifier comprising a first amplifier stage 414 and a second amplifier stage 416. Other amplifier and filter configurations may also be suitable for use with the example embodiments of the present disclosure. However, the configuration of FIG. 4 has advantages in that the voltage follower 412 provides a high input impedance, while the two-stage amplifier 414, 416 provides a sufficient and controllable amount of amplification that maintains the amplified output at a substantially constant order of magnitude.

The voltage follower 412, which is essentially an amplifier with a gain of 1, may be implemented with an operational amplifier (Op Amp) 212. A 1 kiloohm (kΩ) resistor connects an input voltage $V_{IN}$ to the non-inverting input of Op Amp 212. The output of the Op Amp 212 is connected to a 1 microfarad (µF) capacitor 202, and further connected in a feedback loop to the inverting input of Op Amp 212. The capacitor 202 forms an input voltage 204 to the first amplifier stage 414.

The first amplifier stage 414 may be implemented with an Op Amp 214 such as the Model OP177 Ultra Precision Op Amp from Analog Devices, Inc. of Norwood, Mass. A first 10 kΩ resistor connects a non-inverting input of the Op Amp 214 to a supply voltage, e.g., a circuit ground. A second 10 kΩ resistor connects the output of voltage follower 412 at capacitor 202 to an inverting input of the Op Amp 214. The Op Amp 214 also includes a 5 megaohm (MΩ) feedback resistor connecting the output of the Op Amp to its inverting input. With this configuration, the first amplifier stage 414 provides a gain ratio of 500. The output of the Op Amp 214 forms an input voltage 206 to the second amplifier stage 416.

The second amplifier stage 416 may be implemented with another Op Amp 216, which can be different from the Op Amp 214 in the first stage. For example, the second stage Op Amp 216 can be the Model OP17 Precision Op Amp, also from Analog Devices, Inc. The inverting input of Op Amp 216 is connected to the output of Op Amp 214 by a 10 kΩ resistor, which is further connected to the series combination of another 10 kΩ resistor and an adjustable resistor 210 with resistance range from 0 to 5 MΩ. This resistance range accommodates the range of gain values that might be required for the different current levels of the transmission line. Another 10 kΩ resistor connects a supply voltage to the non-inverting input of the Op Amp 214. The supply voltages to the non-inverting inputs of the Op Amps 214 and 216 may, but need not, be the same. With this configuration, the second amplifier stage provides a maximum gain of 501. Additionally, the Op Amps 212, 214 and 216 may be powered by supply voltages $V_{DD}$ and $V_{SS}$.

The output of Op Amp 216 is connected to resistor 218, which is in parallel with a capacitor 220. Example values for resistor 218 and capacitor 220 are 500Ω and 0.1 µF. This particular combination of reference values provides a cutoff frequency of 3183 Hz. Together, the elements 218 and 220 form the low pass filter 420 with a fixed cutoff frequency. For example, the cutoff frequency may be 3,000 Hz for a 60 Hz power system and 2,500 Hz for a 50 Hz power system. The analog output of the low pass filter 420 is supplied to the microprocessor 30 or to an external A/D converter for A/D conversion.

Figure 5:
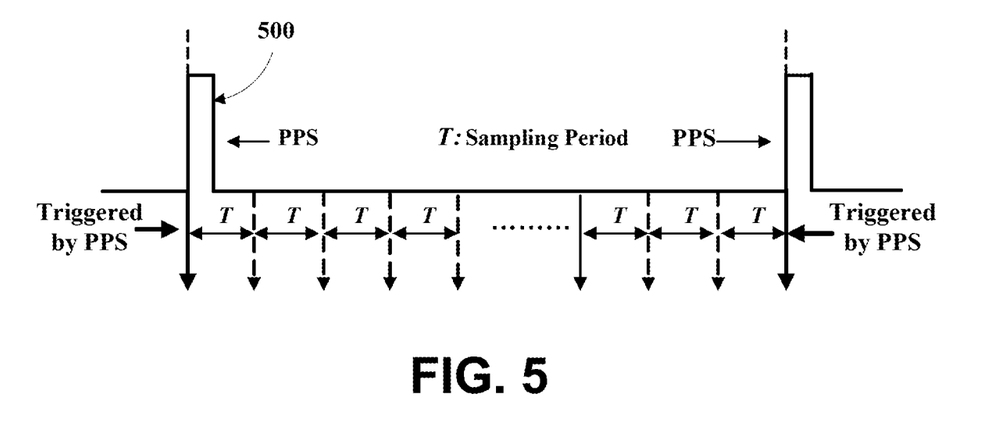
FIG. 5 illustrates synchronous sampling for a GMD/EMP-E3 impact monitoring device according to an embodiment of the present disclosure.

The A/D converter 33 converts an analog output signal from the low pass filter to a digital signal. The sampling rate is preferably at least 6,000 Hz. Microprocessor 30 controls the sampling rate of the A/D converter 33 and processes the digital signal. Sampling may be synchronized to a PPS signal 500 from the GPS receiver, as shown in FIG. 5. Each rising edge of the PPS signal 500 may trigger a start of a new sampling cycle comprising a series of consecutive sampling periods T The length of each synchronous sampling cycle is 1 second to match the period of the PPS signal 500. While the first sampling period Tin any given sampling cycle is triggered by the PPS signal 500, the second sampling period T and all subsequent sampling periods T until the end of the sampling cycle may be controlled by a timer in the microprocessor 30. In this manner, the sampling, and thus the digital output of A/D converter 33, is synchronized. Although it is not necessary to synchronize to a PPS signal, doing so has the advantage that the PPS signal is a highly reliable clock source that can be calibrated to within nanosecond accuracy using GPS time signals. Additionally, the GPS time signals may contain information by which data produced by the system 100, such the digital signal or the calculated THD, may be time stamped for subsequent analysis.

Figure 6:
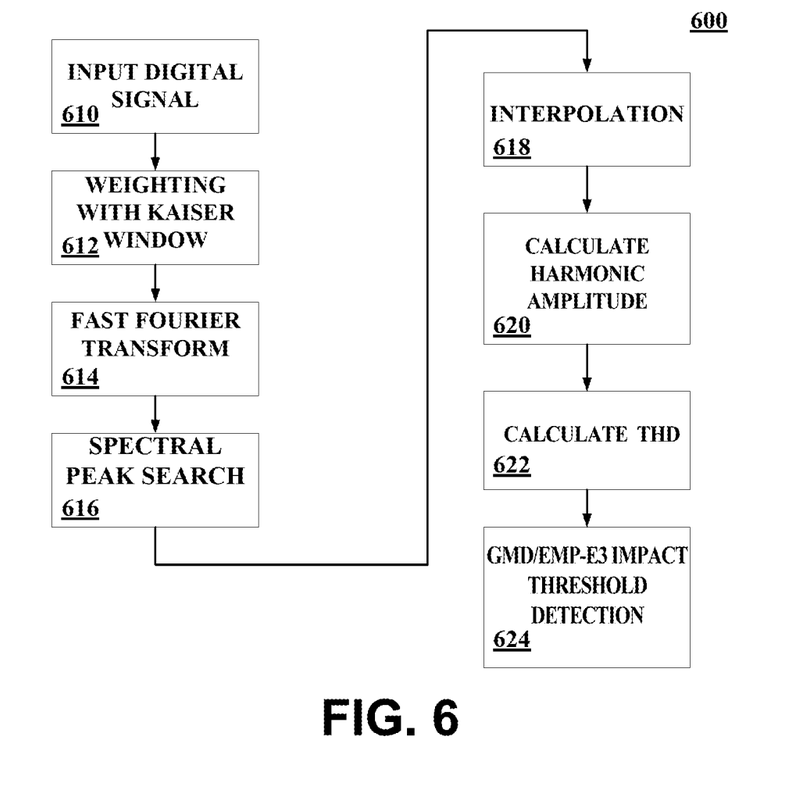
FIG. 6 illustrates a block diagram of an impact monitoring method according to an embodiment of the present disclosure.

The microprocessor 30 processes the synchronized and time stamped digital signal by performing a harmonic measurement algorithm provided by the module 35. FIG. 6 illustrates a flowchart of an FFT-based harmonic measurement algorithm 600. In step 610, a digital signal x(n) from the A/D converter is input to the algorithm 600.

In step 612, the digital signal x(n) is weighted by applying a window function, for example a Kaiser window w(n), to suppress aliasing and spectrum leakage. The windowed signal can be defined as y(n)=x(n)w(n). The Kaiser window is a window function used in digital signal processing and can be expressed as $$w_k(n) = \frac{I_0\left[\beta\sqrt{1-\left(1-\frac{2n}{N-1}\right)}\right]}{I_0(\beta)} \qquad \text{Eq. 6}$$

where k is a sample index, N is the length of the window, β is an adjustment factor, and $I_0(.)$ is a zero-order Bessel function of the first kind.

In step 614, an FFT is applied to the windowed signal y(n).

In step 616, a search is performed to locate peaks in the spectral components of the Fourier transformed signal. Assume that the output of the FFT has two peak lines for any one of the 2nd to h-th harmonic components, and that these peaks are located at $l_{h1}$ and $l_{h2}$ ($l_{h2}=l_{h1}+l_{h1}<k_h<l_{h2}$). Define $y_1=|X(l_{h1})|$ and $y_2=|X(l_{h2})|$, where $y_1$ and $y_2$ are the amplitudes of these maximum and sub-maximum peak lines. X( ) is a vector of the windowed input signal obtained from applying the FFT.

Define a symmetrical coefficient $\tau$ as $$\tau = k_h - l_{h1} - 0.5, \text{ for } -0.5 \leq \tau \leq 0.5 \quad \text{Eq. 7}$$

A coefficient $v$ can then be defined as $$v = (y_2 - y_1)/(y_2 + y_1) \quad \text{Eq. 8}$$

$v$ can be expressed as a function of $\tau$ $$v = g(\tau) = \frac{|W_K(2\pi(-\tau+0.5)/N)| - |W_K(2\pi(-\tau-0.5)/N)|}{|W_K(2\pi(-\tau-0.5)/N)| + |W_K(2\pi(-\tau+0.5)/N)|} \quad \text{Eq. 9}$$

$W_K(.)$ denotes the discrete Fourier transform (DFT) expression of the Kaiser window function. N is the length of the Kaiser window. A typical value of N is 1024.

In step 618, the Fourier transformed signal is interpolated using a polynomial fitting. The fitting polynomial $g^{-1}(v)$ should satisfy $$\tau = g^{-1}(v) \approx a_1 v + a_2 v^2 + a_3 v^3 \quad \text{Eq. 10}$$

The value of $\tau$ can be obtained from equation 10 for L instances (e.g., L>100) of $\tau$ in the range from −0.5 to 0.5. The interpolation may be performed using a polynomial curve fitting function. The interpolation may be performed using hardware, software or a combination thereof. For example, if the microprocessor 30 has access to the MATLAB software available from The MathWorks, Inc., the microprocessor can call the polyfit function using the function call polyfit ($v_i, \tau_i$, 3), after which an inverse-fitting may be performed to obtain values for $a_1$, $a_2$ and $a_3$ in $g^{-1}(v)$. After the coefficients $a_1$, $a_2$ and $a_3$ have been determined, equation 10 can be solved, for example, by a dedicated circuit in the harmonic measurement module 35, to determine $\tau$.

In step 620, the amplitude $A_h$ for the h-th order harmonic can be calculated using the following formula after $\tau$ has been determined as described above, using the two maximum spectral lines and the fitting polynomial $g^{-1}(v)$ $$A_h = \frac{2(y_1+y_2)}{|W_K(2\pi(-\tau+0.5)/N)| + |W_K(2\pi(-\tau-0.5)/N)|} \quad \text{Eq. 11}$$

Step 622 calculates the total harmonic distortion THD, which is used in a threshold detection in step 624. According to the principles of magnetic induction, the magnetic field is proportional to the frequency of the signal. Thus, to obtain the harmonic distortion associated with the h-th harmonic, the amplitude of the h-th harmonic is divided by the order number h in the following equation for calculating THD.

$$THD = \sum_{h=2}^{H} \frac{A_h}{h \cdot A_0} \quad \text{Eq. 12}$$

where $A_h$ is the harmonic amplitude for the h-th harmonic from step 620, $A_0$ is the amplitude of the fundamental harmonic, and H is the highest order of harmonic component for which the amplitude is to be calculated in step 620. The value of H can be set according to the local performance requirements of the system in which the monitoring device is deployed. A large value of H will increase the accuracy but will also increase the computation burden of the device. An example H value is 50.

In addition to THD, some embodiments may perform a threshold detection using the change in THD, denoted as C, from i to i+1 using the following equation $$C = THD_{i+1} - THD_i \quad \text{Eq. 13}$$

where i is the time sequence of THD.

A threshold value $\varepsilon$ for THD and a threshold value $\delta$ for C may be specified prior to the threshold detection. The threshold values will vary depending on the parameters of the power system, including the transmission line. For example, some power systems may be able to handle higher THD or higher C than other power systems. In step 624, if it is determined that $THD_{i+1}$ and the change of THD C exceed their respective threshold values and $\delta$, the microprocessor 30 will issue a command to activate the alarm system 60. The alarm system may enact appropriate protective measures, such as reducing the amount of load connected to the power system, or activating a neutral blocking device (NBD) located in the neutral path of a transformer to which the transmission line or bus is connected. The alarm system 60 may remain activated at least until $THD_{i+1}$ goes below the threshold $\varepsilon$. Deactivation of the alarm may optionally be further conditioned on C going below $\delta$.

In addition to the threshold detection, the microprocessor may transmit GMD/EMP-E3 impact detection results to the communication module for transmission to a remote server via the Internet. The transmitted results may include the THD, the change of THD C, and the amplitude of each harmonic component $A_h$.

Figure 7:
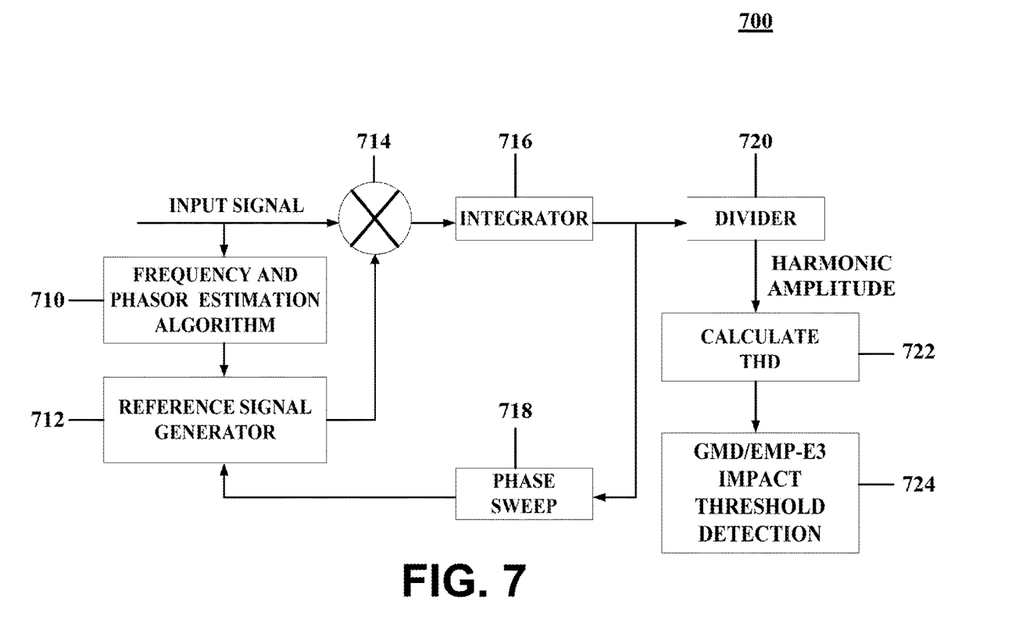
FIG. 7 illustrates a block diagram of an impact monitoring method according to an embodiment of the present disclosure.

Another method to obtain the amplitude $A_h$ of the h-th order harmonic is to use a PSD algorithm. FIG. 7 illustrates a flowchart of a PSD-based harmonic measurement algorithm 700. In step 710, the fundamental frequency of the input signal x(n) is estimated, denoted as $f_0$. The phasor of the input signal may also be estimated in order to obtain x(n). An example algorithm for estimating the fundamental frequency based on the phasor is described below in connection with FIG. 8.

In step 712, a reference signal generator generates a sinusoidal reference signal r(n) with a frequency equal to $hf_0$ and an amplitude of $A_1$ according to equation 14 below. The reference signal has a frequency equal to the frequency of a harmonic component whose amplitude is to be calculated, i.e., a harmonic of interest.

$$r(n) = A_1 \sin(2\pi h f_0 n + \theta) \quad \text{Eq. 14}$$

In step 714, the input signal and the reference signal are input to a multiplier to produce a demodulated signal.

In step 716, the demodulated signal is applied to an integrator that produces an integrated signal $y(\theta)$ from the demodulated signal.

In step 718, a phase sweep module produces a phase signal from the integrated signal. The sampling rate of the reference signal is the same as the input signal. Here $\theta$ is the angle of the reference signal. The phase sweep module sweeps the value of $\theta$ from 0 to $2\pi$, and supplies the $\theta$ values to the reference signal generator. The interactions between the input signal, the output of the reference signal generator, and the multiplier will take the reference signal and the input signal over a period having a length of N points, and multiply the corresponding points of the reference signal and the input signal.

The sweeping produces a feedback loop to the integrator, which performs the integration in step 716 to update the integrated signal by calculating the accumulation of the multiplications as follows $$y(\theta) = \sum_{i=1}^{N} r(i, \theta) \cdot EF(i) \quad \text{Eq. 15}$$

where N is the number of points to accumulate. Increasing N will increase the duration over which the integration is performed. Preferably, N is set large enough so that the points cover multiple periods of the harmonic signal.

The accumulation result is dependent on the value of θ, and has the following relationship with the amplitude of the harmonic.

$$y(\theta) = \frac{A_h A_1}{2} \cos(\theta - \phi_h) \quad \text{Eq. 16}$$

When θ is equal to $\phi_h$, the initial phase angle of the harmonic component, y reaches its maximum value, and the amplitude of the harmonic of interest can be calculated from the integrated signal using the formula $$A_h = \frac{2y_{max}}{A_1} \quad \text{Eq. 17}$$

The calculation of the harmonic amplitude according to equation 17 can be performed using a divider unit in step 720. The divider unit detects $y_{max}$ in the integrated signal to form the numerator in equation 17, and divides by the denominator $A_1$.

Using a smaller step size for the sweeping of θ will get θ closer to $\phi_h$ and y closer to the maximum value, but it will take longer to calculate the amplitude of the harmonic. On the other hand, a larger step size for θ will introduce more error in the calculated amplitude, but reduces computation, and thus overall detection time. An exemplary sweeping step is 0.001 radians.

Using method 700, the amplitude of all harmonic components of interest can be obtained. While there is no theoretical limit to how many amplitudes are calculated, it may be desirable to limit the amplitude calculation to harmonics from the 2nd to the 50th order (hence the range of values for h in equation 12). In fact, GMD/EMP-E3 impact can generally be detected with less than the 10th order, although with less accuracy compared to when additional harmonics are processed. In one embodiment, only even harmonics (h=2, 4, 6, etc.) may be considered, because even harmonics are readily attributed to GMD/EMP-E3, whereas odd harmonics can sometimes be produced by other sources.

After the amplitudes of the harmonics of interest have been calculated, the THD and the change of THD can be calculated using Eq. 12 and Eq. 13 (step 722). This calculation can be performed in the same manner as the FFT-based algorithm in FIG. 6, step 622.

In step 724, the THD and the change of THD can be compared to respective thresholds E and 6, similar to FIG. 6, step 624. The microprocessor will then trigger a command to activate the alarm system if both THD and the change in THD surpass their respective thresholds, and keep the alarm activated at least until the THD goes below the threshold E. Deactivation of the alarm may optionally be further conditioned on the change in THD going below the threshold 6.

Figure 8:
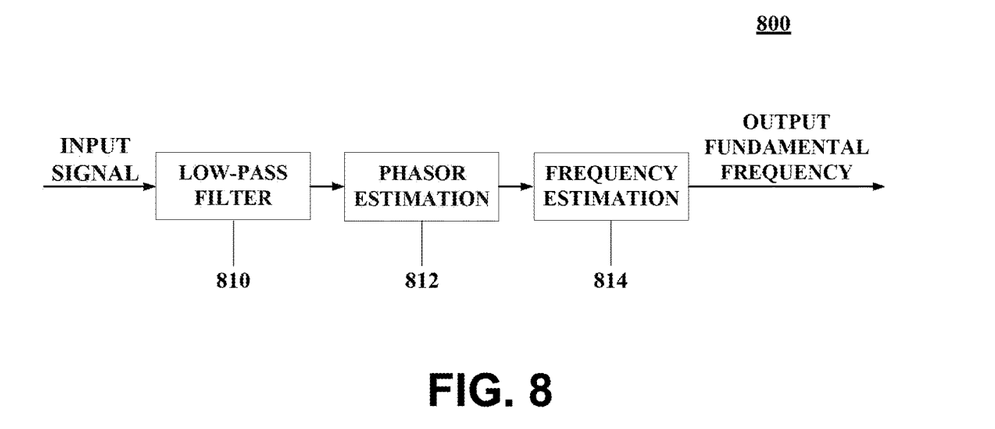
FIG. 8 illustrates a block diagram of an algorithm for estimating a fundamental frequency according to an embodiment of the present disclosure.

In the method 700, the estimate of the fundamental frequency is a prerequisite to calculating the harmonic amplitude. The estimate is necessary because the actual fundamental frequency (and thus the harmonic frequencies) of a transmission line will vary slightly over time rather than remain constant. Therefore, the method 700 is more computation intensive than method 600, but is more sensitive, detecting relatively weak harmonics and potentially permitting more accurate monitoring in noisy situations. Various frequency estimation algorithms exist which may provide the fundamental frequency estimate used in the method 700. FIG. 8 presents a DFT based frequency estimation algorithm 800 according to an embodiment of the present disclosure.

In step 810, a low pass filter is applied to the input signal from the A/D converter. Given a set of samples from the input signal, denoted as x(n), the samples can be filtered to eliminate noise, unwanted harmonics, and aliasing.

In step 812, the phasor X(i) of the input signal is calculated using the formula below.

$$X(i) = \frac{\sqrt{2} \sum_{k=-\frac{N}{2}}^{\frac{N}{2}} W(k) \cdot x(i+k) \cdot e_0^{-j(i+k)\Delta t \omega_0}}{\sum_{k=-\frac{N}{2}}^{\frac{N}{2}} W(k)} \quad \text{Eq. 18}$$

In equation 18, $\omega_0 = 2\pi f_0$ where $f_0$ is the nominal frequency of the power system; Δt is the time between neighboring samples; W(k) is a low-pass filter coefficient; and N is the sample number of the input set, as well as the order of the low-pass filter. An example of a filter suitable for use in step 810 is a finite impulse response (FIR) filter based on the normalized sinc function and the Hamming window function.

$$W(k) = \frac{\sin\left(2\pi \cdot \frac{2F_{fr}}{f_s} \cdot k\right)}{2\pi \cdot \frac{2F_{fr}}{f_s} \cdot k} \cdot \left(0.54 - 0.46\cos\left(2\pi \cdot \frac{n}{N}\right)\right) \quad \text{Eq. 19}$$

where $F_{fr}$ is the low-pass filter reference frequency, and $f_s$ is the sampling frequency. For the application of frequency estimation for a power system with a nominal frequency of 60 Hz and an output data rate of 60 Hz, example values of $F_{fr}$, $f_s$, and N can be 10.32, 960, and 96, respectively.

In step 814, the fundamental frequency is estimated and output to the reference signal generator for processing in step 712 of FIG. 7. The fundamental frequency can be estimated using the formula below $$f(i) = \frac{\theta(i) - \theta(i-1)}{2\pi \Delta t} \quad \text{Eq. 20}$$

where θ(i) is the angle of the phasor X(i).

Although the disclosure has been described with reference to several exemplary embodiments, it may be understood that the words that have been used may be words of description and illustration, rather than words of limitation. Changes may be made within the purview of the appended claims, as presently stated and as amended, without departing from the scope and spirit of the disclosure in its aspects. Although the disclosure has been described with reference to particular embodiments, the disclosure may be not intended to be limited to the particulars disclosed; rather the disclosure extends to all functionally equivalent structures, methods, and uses such as may be within the scope of the appended claims.

Dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof, including embodiments which may be implemented using code segments in computer-readable storage media.

The illustrations of the embodiments described herein may be intended to provide a general understanding of the various embodiments. The illustrations may be not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations may be merely representational and may not be drawn to scale. Certain proportions within the illustrations may be exaggerated, while other proportions may be minimized. Accordingly, the disclosure and the figures may be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure may be intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than may be expressly recited in each claim. Rather, as the following claims reflect, inventive subject matter may be directed to less than all of the features of any of the disclosed embodiments. Thus, the following claims may be incorporated into the Detailed Description, with each claim standing on its own as defining separately claimed subject matter.

The above disclosed subject matter may be to be considered illustrative, and not restrictive, and the appended claims may be intended to cover all such modifications, enhancements, and other embodiments which fall within the true spirit and scope of the present disclosure. Thus, to the maximum extent allowed by law, the scope of the present disclosure may be to be determined by the broadest permissible interpretation of the following claims and their equivalents, and shall not be restricted or limited by the foregoing detailed description.

What is claimed is:

1. A monitoring device for monitoring an impact of Geomagnetic disturbances (GMDs) or an E3 component of electromagnetic pulses (EMP-E3), the monitoring device comprising:
   a transducer configured to generate a transduced signal in response to a magnetic field of a current carrying element of a transmission line, wherein the transduced signal reflects harmonic characteristics of a current of the current carrying element;
   an amplifier configured to generate an amplified signal from the transduced signal;
   a low pass filter to generate a filtered signal by low pass filtering the amplified signal; and
   a microprocessor comprising:
      a harmonic measurement module configured to determine a total harmonic distortion (THD) associated with the current of the current carrying element responsive to the filtered signal; and
      a threshold detection module configured to detect excessive GMD or EMP-E3 impact based on whether a change in the THD meets a threshold THD change value.

2. The monitoring device of claim 1, wherein the harmonic measurement module is further configured to receive a digital signal based on the filtered signal, to calculate amplitudes of harmonic components within the digital signal, and to determine the THD based on the amplitudes of the harmonic components.

3. The monitoring device of claim 2, wherein the digital signal is formed by an analog-to-digital (A/D) converter, and wherein the microprocessor is further configured to synchronize a sampling activity of the A/D converter using a timing signal.

4. The monitoring device of claim 3, wherein the timing signal is a pulse per second signal formed using a global positioning system.

5. The monitoring device of claim 2, wherein the threshold detection module is further configured to detect excessive GMD or EMP-E3 impact based on whether the change in the THD meets the threshold THD change value and whether the THD meets a threshold THD value.

6. The monitoring device of claim 2, wherein the harmonic measurement module is further configured to:
   weight the digital signal using a window function;
   apply a fast Fourier transform to the weighted digital signal, thereby forming a
   transformed signal;
   interpolate the transformed signal, thereby forming an interpolated signal; and calculate the amplitudes from the interpolated signal.

7. The monitoring device of claim 6, wherein the window function is a Kaiser window.

8. The monitoring device of claim 6, wherein the interpolation is performed for individual harmonies, between maximum and sub-maximum spectral lines associated with an individual harmonic.

9. The monitoring device of claim 6, wherein the interpolation uses a polynomial fitting, and wherein the amplitudes are calculated using an inverse fitting.

10. The monitoring device of claim 2, wherein e harmonic measurement module is further configured to:
   estimate a fundamental frequency of the digital signal;
   generate a reference signal from, the estimated fundamental frequency and a phase
   signal, wherein the reference signal has a frequency equal to the frequency of a
   harmonic component whose amplitude is to he calculated;
   multiply the digital signal with the reference signal, thereby forming a demodulated signal;
   integrate the, demodulated signal, thereby forming an integrated signal;
   phase sweep, the integrated signal, thereby forming the phase signal; and calculate the amplitudes from the integrated signal.

11. A processor-implemented method for monitoring an impact of Geomagnetic disturbances (GMDs) or an E3 component of electromagnetic pulses (EMP-E3), the method comprising:
   converting an analog signal from a transducer into a digital signal, wherein the analog signal is transduced in response to a magnetic field of a current carrying element of a transmission line, and wherein the analog signal reflects harmonic characteristics of a current of the current carrying element; and
   determining a total harmonic distortion (THD) associated with the current of the current carrying element responsive to the digital signal;
   detecting excessive GMD air EMP-E3 impact based on whether a change in the THD meets a threshold THD change value.

12. The method of claim 11, further comprising:
   calculating amplitudes of harmonic components within the digital signal;
   wherein determining the THD comprises determining the THD based on the amplitudes of the harmonic components.

13. The method of claim 12, further comprising:
   synchronizing a sampling activity of an analog-to-digital (A/D) converter that forms the digital signal, using a timing signal.

14. The method of claim 13, wherein the timing signal is a pulse per second signal formed using a global positioning system.

15. The method of claim 12, further comprising:
   determining whether the THD determined based on the amplitudes meets a threshold THD value;
   wherein detecting the excessive GMD or EMP-E3 impact comprises detecting the excessive GMD or EMP-E3 impact based on whether the change in the THD meets threshold THD change value and whether the THD meets the threshold THD value.

16. The method of claim 12, further comprising: weighting the digital signal using a window function; applying a fast Fourier transform to the weighted digital signal, thereby forming a transformed signal;
   interpolating the transformed signal, thereby forming an interpolated signal; and
   calculating the amplitudes from the interpolated signal.

17. The method of claim 16, wherein the window function is a Kaiser window.

18. The method of claim 16, wherein the interpolation is performed for individual harmonies, between maximum and sub-maximum spectral lines associated with an individual harmonic.

19. The method of claim 16, wherein the interpolation uses a polynomial fitting, and wherein the amplitudes are calculated using an inverse fitting.

20. The method of claim 12, further comprising:
   estimating a fundamental frequency of the digital signal;
   generating a reference signal from the estimated fundamental frequency and a phase signal, wherein the reference signal has a frequency equal to the frequency of a harmonic component whose amplitude is to be calculated;
   multiplying the digital signal with the reference signal, thereby forming a demodulated signal;
   integrating the demodulated signal, thereby forming an integrated signal; phase sweeping the integrated signal, thereby forming the phase signal; and
   calculating the amplitudes from the integrated signal.

* * * * *